(12) United States Patent
Hung

(10) Patent No.: US 8,541,147 B2
(45) Date of Patent: Sep. 24, 2013

(54) SYSTEM AND METHOD OF SELECTIVE OPTICAL PATTERN ENHANCEMENT FOR SEMICONDUCTOR MANUFACTURING

(75) Inventor: Chi Yuan Hung, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 267 days.

(21) Appl. No.: 13/035,900

(22) Filed: Feb. 25, 2011

(65) Prior Publication Data
US 2011/0217660 A1 Sep. 8, 2011

(30) Foreign Application Priority Data
Mar. 5, 2010 (CN) .......................... 2010 1 0118841

(51) Int. Cl.
*G03F 1/70* (2012.01)
(52) U.S. Cl.
USPC .................................................. 430/5; 430/30
(58) Field of Classification Search
USPC ..................... 430/5, 30, 394; 716/50–56
See application file for complete search history.

(56) References Cited

U.S. PATENT DOCUMENTS

| | | | |
|---|---|---|---|
| 2002/0071997 A1* | 6/2002 | Ahrens et al. | 430/5 |
| 2004/0168147 A1* | 8/2004 | Dai et al. | 716/19 |

FOREIGN PATENT DOCUMENTS

CN 101625521 A 1/2010

\* cited by examiner

*Primary Examiner* — Stephen Rosasco
(74) *Attorney, Agent, or Firm* — Kilpatrick Townsend & Stockton LLP

(57) ABSTRACT

System and method of selective optical pattern enhancement for semiconductor manufacturing. A method for performing a photolithography process includes providing a reticle pattern for a photomask, the reticle pattern including one or more active areas, the photomask including at least a first active area and a first insulation area. The method also includes identifying a first structure pattern defined by the reticle pattern. Additionally, the method includes defining a block area covering the first structure, the block area being positioned within the active area. The method further includes applying at least a first optical proximity correction to the reticle pattern to form a corrected pattern, the first optical proximity correction being restricted to the block area. Also, the method includes transferring the corrected pattern to a wafer.

20 Claims, 8 Drawing Sheets

SYSTEM AND METHOD OF SELECTIVE OPTICAL PATTERN ENHANCEMENT FOR SEMICONDUCTOR MANUFACTURING

CROSS-REFERENCES TO RELATED APPLICATIONS

This application claims priority to Chinese Patent Application No. 201010118841.4, filed Mar. 5, 2010, which is commonly owned and incorporated by reference herein for all purposes.

BACKGROUND OF THE INVENTION

Embodiments of the present invention relate to a semiconductor processing for the manufacture of semiconductor devices. More particularly, embodiments of the present invention provide a method and device for generating suppress bars and selective optical proximity correction for the manufacture of integrated circuits.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Some semiconductor devices are now being fabricated with features less than 70 nanometers across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility.

Making devices smaller is very challenging, as each process used in IC fabrication has a limit. Various process limitations have made IC fabrication more difficult as the devices get smaller. One area of fabrication technology in which such limitations have appeared is photolithography.

Photolithography involves selectively exposing regions of a resist coated silicon wafer to an illumination pattern, and then developing the exposed resist in order to selectively protect regions of wafer layers.

An integral component of photolithographic apparatus is a "reticle" which includes a pattern corresponding to features at one layer in an IC design. The reticle typically includes a transparent glass plate covered with a patterned light blocking material (e.g., a mask) such as chromium. The reticle is placed between an illumination source producing light of a pre-selected wavelength and a focusing lens which may form part of a "stepper" apparatus. Placed beneath the stepper is a photoresist-covered silicon wafer. When light from the illumination source is directed onto the reticle, it passes through the glass plate (regions not having chromium patterns) and projects an image onto the photoresist covered silicon wafer. As the exposure wavelength of modern micro lithographic tools continue to decrease, chemically amplified photoresists are becoming more important. Chemical amplification serves to increase the sensitivity of photoresists by creating a photo-generated catalyst (typically an acid) during the exposure. The photoresist is typically baked to undergo chemical changes that alter its dissolution properties. Subsequent development process (e.g., removing the photoresist using etching and/or rinsing) is needed to obtain the projected image on wafer. In this manner, an image of the reticle is transferred to the photoresist.

As light passes through the reticle, it is refracted and scattered by the chromium edges. This causes the projected image to exhibit some rounding and other optical distortion. Furthermore, resist processing effects during the bake process, such as nonlinear diffusion of the photo-generated acid, exacerbate the pattern distortion on the wafer. Subsequent pattern transfer processing effects, such as etch bias, further degrade the pattern fidelity. While such effects pose relatively little problem in layouts with large feature sizes (e.g., layouts with critical dimensions above about 1 micron), they cannot be ignored in layouts having feature sizes smaller than about 1 micron. The problems become especially pronounced in IC designs having feature sizes near the wavelength of light used in the photolithographic process. Recently some semiconductor devices have scaled down to 60 nm.

To remedy this problem, a reticle correction technique known as Optical Proximity Corrections (OPC) has been developed. Optical Proximity Correction involves adding dark regions to and/or subtracting dark regions from a reticle design at locations chosen to overcome the distorting effects of diffraction and scattering. Typically, OPC is performed on a digital representation of a desired IC pattern. First, the digital pattern is evaluated with software to identify regions where optical distortion will result. Then the optical proximity correction is applied to compensate for the distortion. The resulting pattern is ultimately transferred to the reticle glass. In addition to the OPC techniques, resolution enhancement technique (RET) is also used to improve quality of reticle patterns. Sometimes, RET is referred to as a type of OPC. In the following sections, resist and photoresist are used interchangeably; mask, photomask, and reticle are used interchangeably; and mask pattern and reticle pattern are used interchangeably.

BRIEF SUMMARY OF THE INVENTION

Embodiments of the present invention relate to a semiconductor processing for the manufacture of semiconductor devices. More particularly, the present invention provides a method and device for generating suppress bars and selective optical proximity correction for the manufacture of integrated circuits.

An embodiment of the present invention provides a method for performing a photolithography process. The method includes providing a reticle pattern for a photomask, the reticle pattern including one or more active areas, the photomask including at least a first active area and a first insulation area. The method also includes identifying a first structure pattern defined by the reticle pattern. Additionally, the method includes defining a block area covering the first structure, the block area being positioned within the active area. The method further includes applying at least a first optical proximity correction to the reticle pattern to form a corrected pattern, the first optical proximity correction being restricted to the block area. The method also includes transferring the corrected pattern to a wafer. In an embodiment, the method further includes applying a resolution enhancement technique to the reticle pattern to ensure that the corrected pattern is less sensitive to focus and/or dose change.

Another embodiment of the present invention provides a method for performing a photolithography process. The method includes providing a reticle pattern for a photomask, the reticle pattern including one or more active areas, the photomask including at least a first active area and a first polysilicon area. The method also includes identifying a first structure pattern defined by the reticle pattern. The method further includes defining a block area covering the first structure, the blocked area being covering at least a portion of the active area, the block area being less than 10% the size of the reticle pattern. The method additionally includes applying at least a first RET process to the reticle pattern to form a corrected pattern, the first RET process being restricted to the block area. Also, the method includes transferring the corrected pattern to a wafer.

It is to be appreciated that embodiments of the present invention provide many advantages over conventional techniques. According to various embodiments, OPC and/or RET processes are performed on selected areas and/or structures of reticle patterns, instead being applied to the entireties of the reticle patterns. As a result, the amount of process time is reduced and the workflow is simplified. In certain embodiments, techniques according to the present invention are compatible with existing systems. For example, various processes according to embodiments of the present invention for selective OPC and/or RET are implemented as software added on to the existing reticle pattern software. There are other benefits as well.

Various additional embodiments, features, and advantages of the present invention, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION OF THE INVENTION

Embodiments of the present invention relate to a semiconductor processing for the manufacture of semiconductor devices. More particularly, embodiments of the present invention provide a method and device for generating suppress bars and selective optical proximity correction for the manufacture of integrated circuits.

As mentioned above, performing OPC on reticle patterns is time consuming and requires huge amount of computer resources. For example, reticle patterns are usually stored as large-size files. To perform OPC and/or a reticle pattern or design, a machine (e.g., a dedicated computer) is required to process the entirety of the reticle pattern. This process typically takes a very long time to complete.

Therefore, it is appreciated that embodiments of the present inventions provide new and improved system and methods for performing OPC and RET processes in a more efficient manner. More specifically, portions of reticle patterns are identified for the purpose of performing OPC and/or RET processes. For example, the identification of the portions can be performed either automatically or manually. In some embodiments, the identified portions represent less than about 10 percent of the photomask or reticle.

Figure 1:
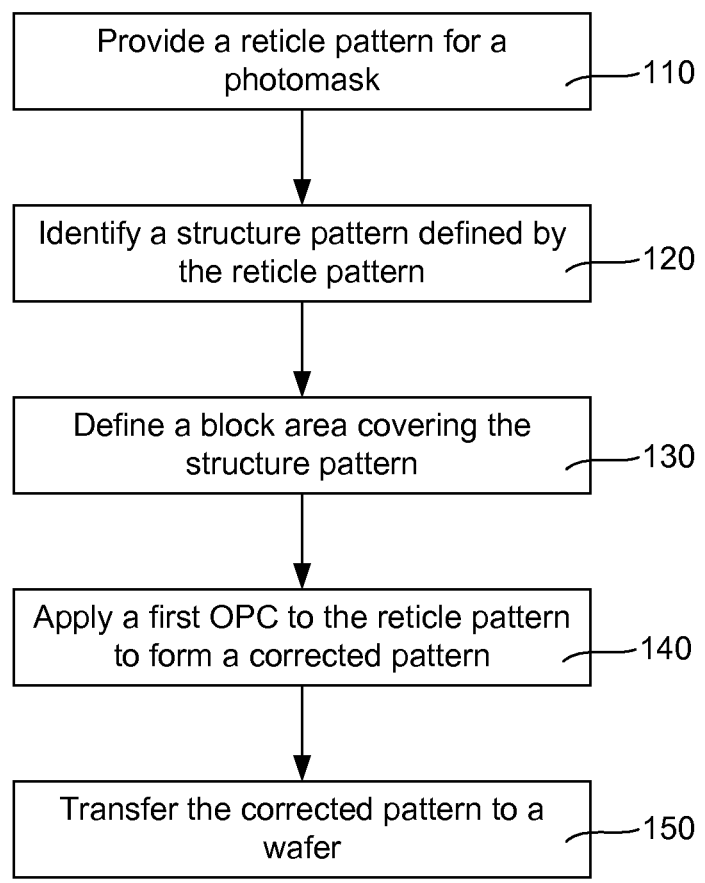
FIG. 1 is a simplified flow diagram of a method for performing a photolithographic process according to an embodiment of the present invention.

FIG. 1 is a simplified flow diagram of a method for performing a photolithographic process according to an embodiment of the present invention. This diagram is merely an example, which should not unduly limit the scope of the claims. One of ordinary skill in the art would recognize many variations, alternatives, and modifications. The method includes the following processes:

1. Process 110 for providing a reticle pattern for a photomask;
2. Process 120 for identifying at least a first structure pattern defined by the reticle pattern;
3. Process 130 for defining a block area covering the first structure pattern;
4. Process 140 for applying a first optical proximity correction to the reticle pattern to form a corrected pattern, the first optical proximity correction being restricted to the block area; and
5. transferring the corrected pattern to a wafer.

The above sequence of processes provides a method according to an embodiment of the present invention. Other alternatives can also be provided where processes are added, one or more processes are removed, or one or more processes are provided in a different sequence without departing from the scope of the claims herein. Details of the present invention can be found throughout the present specification and more particularly below.

Figure 2:
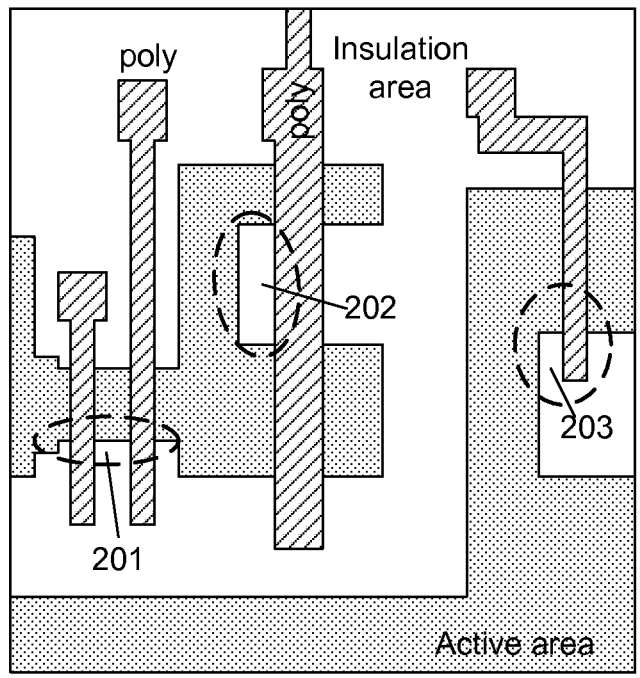
FIG. 2 is a simplified diagram illustrating a reticle pattern according to an embodiment of the present invention.

At the process 110, a reticle pattern for a photomask is provided. FIG. 2 is a simplified diagram illustrating a reticle pattern according to an embodiment of the present invention. As shown in FIG. 2, the reticle pattern includes polysilicon areas (diagonal dashed), active areas (grey), and insulation areas (blank) According to an embodiment, an OPC technique (e.g., corner shape compensation, L-shape compensation) is specifically used to help retain the shape of structures in the active areas.

At the process 120, one or more areas are identified based on the structure patterns within the active areas. For example, one or more blocks of area within the reticle pattern are identified. According to an embodiment, blocks of area are identified based on the types of structures to be defined in the active areas. For example, structures that contains small corners (e.g., corners that are susceptible to rounding when the reticle pattern is projected to a smaller size), closely juxtaposed structures, structures including polysilicon overlying active areas, structures that are associated with critical electrical interconnects, are the basis for identifying the structure patterns. As shown in FIG. 2, structure patterns 201, 202, and 203 are identified.

The process for identifying the structure patterns may be performed manually and/or automatically. In an embodiment, the process of identifying structure patterns is performed by an operator. In an alternative embodiment, the process of identifying the structure patterns is performed automatically. That is, structure patterns that satisfy one or more criteria (e.g., critical dimension, small corner, etc.) are identified.

Figure 3:
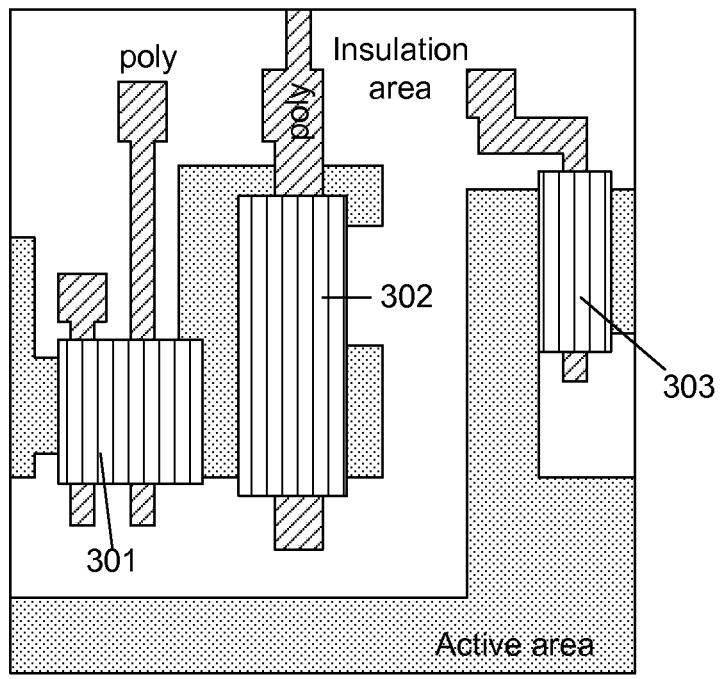
FIG. 3 is simplified diagram illustrating a block reticle area that is designated for OPC processes.

After identifying the structure patterns, associated block areas are defined to cover the identified structure patterns. It is understood that a block area may have one or more structure pattern that require optical proximity correction. OPC operations are applied to the reticle pattern. FIG. 3 is simplified diagram illustrating block areas 301, 302, and 303 of the reticle that is designated for OPC processes. This diagram is merely an example, which should not unduly limit the scope of the claims. One of ordinary skill in the art would recognize many variations, alternatives, and modifications. In an embodiment, block areas 301, 302, and 303 are defined as marked zones or masks at the process 130. But it is to be understood the lines of the marked zones or mask areas are for illustration purpose only. Other types of mask and/or marking may be used to identify the block areas that need OPC processes.

Figure 4:
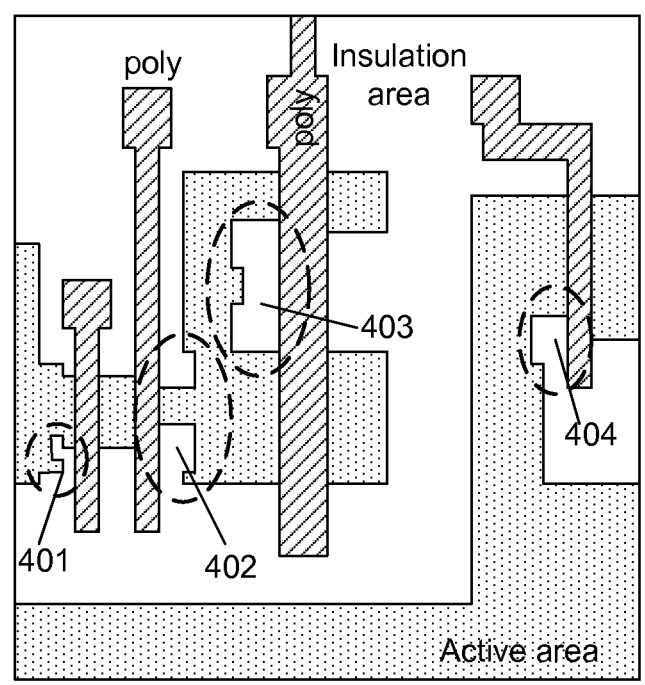
FIG. 4 is a simplified diagram illustrating a reticle pattern with selective OPC processes performed.

At the process 140, one or more OPC processes are performed at the block areas. Depending on the specific shape and/or structure involved, rule-based and/or model-based OPC processes are performed. FIG. 4 is a simplified diagram illustrating a reticle pattern with selective OPC processes performed. This diagram is merely an example, which should not unduly limit the scope of the claims. One of ordinary skill in the art would recognize many variations, alternatives, and modifications. As shown in FIG. 4, actives areas 401, 402, 403, and 404 show structures having modified shapes after OPC processes, while the areas that were not affected by the OPC processes remain unchanged. In a preferred embodiment, the block areas represent less than 10 percent of the total area of the photomask.

It is to be appreciated by selectively applying OPC processes, the cost (e.g., in terms of computational time, processing power, hardware requirements) associated with OPC processes according to embodiments of the present invention is greatly reduced in comparison to conventional OPC processes. For example, depending on the size of the block areas in comparison to the total area of reticle patterns, the amount of OPC running time according to an embodiment of the present invention can be less than 20% of the amount of OPC running time required by conventional techniques.

After the OPC processes are performed, the corrected reticle pattern is ready for transferring to the wafer at the process 150.

It is to be appreciated that the embodiments of the present invention may be applicable to other optical enhancement methods, such as RET process. Embodiments of the present invention may also be applicable in combination of one or more RET processes.

As discussed above and further emphasized here, FIG. 1 is merely an example, which should not unduly limit the scope of the claims herein. An additional process for performing a photolithographic process can also be performed.

Figure 5:
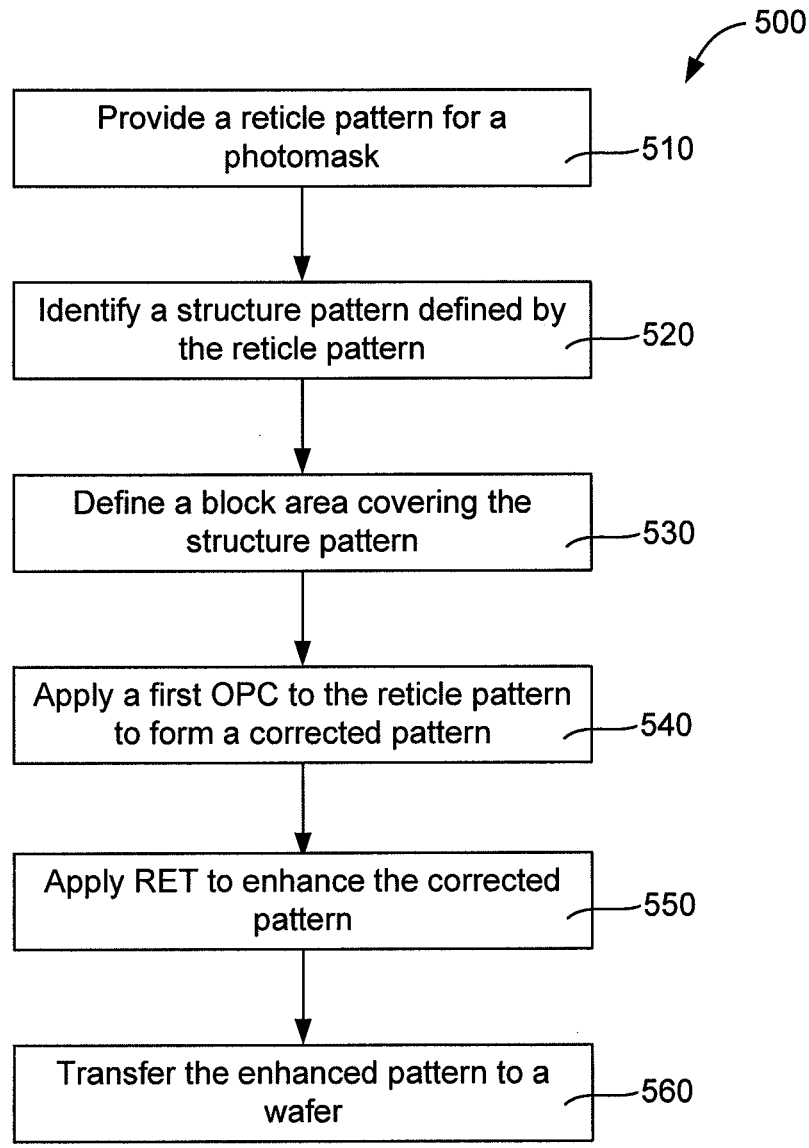
FIG. 5 is a simplified flow diagram of a method for performing a photolithographic process according to another embodiment of the present invention.

FIG. 5 is a simplified flow diagram of a method 500 for performing a lithographic process according to an embodiment of the present invention. The method includes the following steps:
1. providing a reticle pattern for a photomask (step 510);
2. identifying a first structure pattern defined by the reticle pattern (step 520);
3. defining a block area covering the first structure pattern, the blocked area being covering at least a portion of the active area (step 530);
4. applying at least a first optical proximity correction process to the reticle pattern to form a corrected pattern (step 540);
5. applying at least a first RET process to enhance the corrected pattern (step 550);
6. transferring the corrected pattern to a wafer (step 560).

Resolution enhancement techniques (RET) can coax light into resolving shapes much smaller than its wavelength. In an embodiment, one of the RET approaches includes off-axis illumination. This off-axis illumination approach changes the angle at which light passes through the photomask (reticle) by inserting special holographic geometric pattern and allows light to fall on the original photomask only at particular angles. When the angle of illumination and the angle of diffraction are matched, the amount of light diffracted can be enhanced and the contrast of the image improve.

Figure 6:
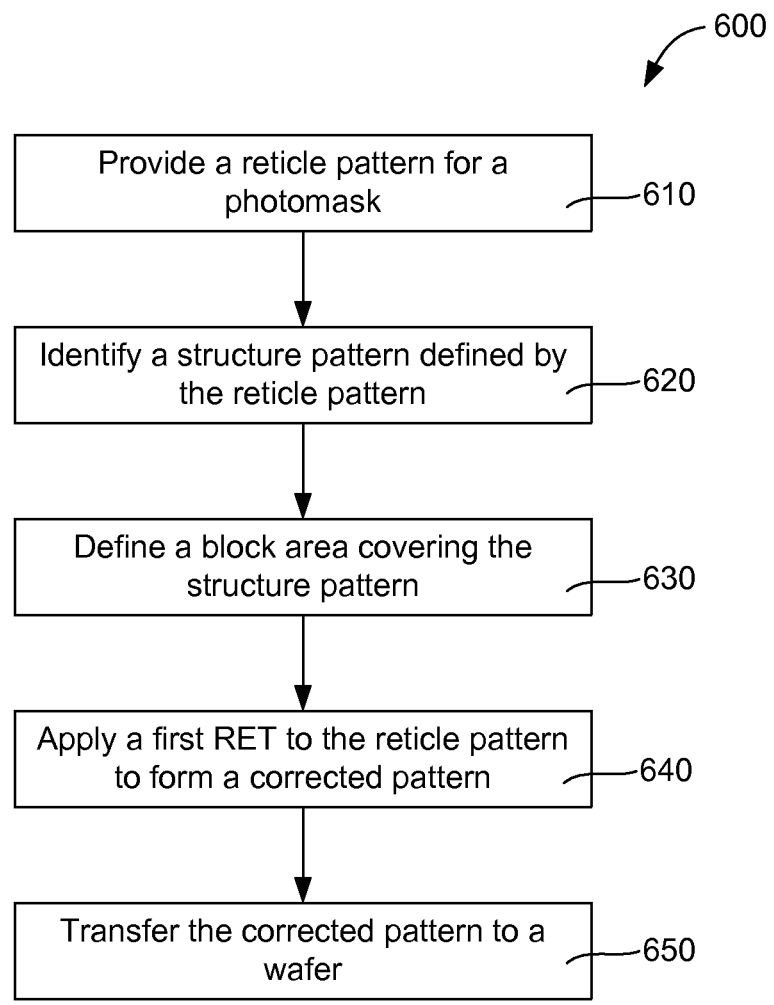
FIG. 6 is a simplified flow diagram of a method for performing a lithographic process according to yet another embodiment

In another embodiment, RET can be used instead of OPC. FIG. 6 is a simplified flow diagram of a method 600 for performing a photolithographic process according to an embodiment of the present invention.

Figure 7:
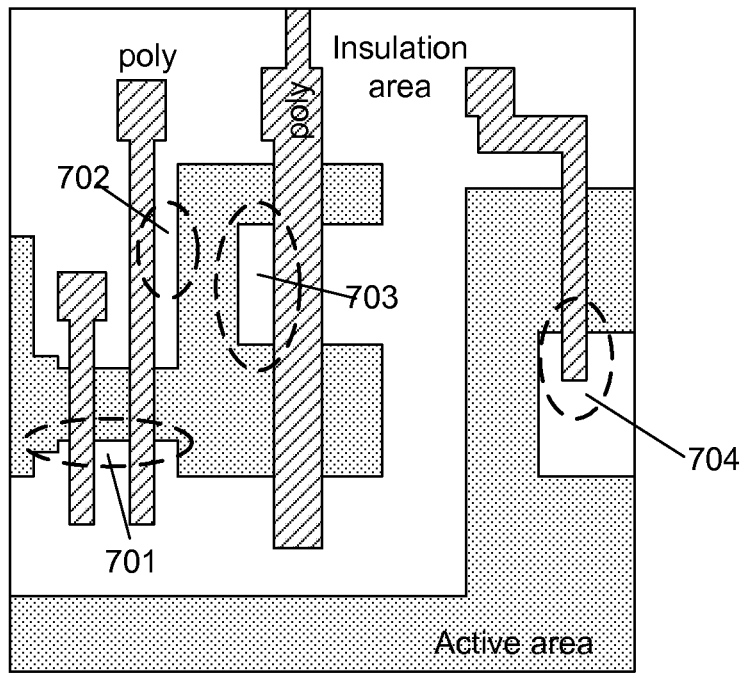
FIG. 7 is a simplified diagram illustrating a reticle pattern according to an embodiment of the present invention.

At step 610, a reticle pattern for a photomask is provided. FIG. 7 is a simplified diagram illustrating a reticle pattern according to an embodiment of the present invention. This diagram is merely an example, which should not unduly limit the scope of the claims. One of ordinary skill in the art would recognize many variations, alternatives, and modifications. As shown in FIG. 7, the reticle pattern includes polysilicon areas, active areas, and insulation areas. According to an embodiment, an RET technique is specifically used to help retain the shape of structures in the polysilicon areas. For example, projected images may overlap on the wafer when structure patterns on the photomask (reticle) are placed very closely. In an embodiment, RET may use phase shift for pattern resolution enhancement. In another embodiment, RET may use off-axis illumination to improve the resolution of repetitive structure patters of the photomask (reticle).

At step 620, one or more structure patterns are identified based on the patterns within the active areas. For example, one or more structure patterns within the reticle pattern are identified. According to an embodiment, structure patterns are identified based on the types of structures to be defined in relation with the active areas. For example, structure patterns that contains small corners (e.g., corners that are susceptible to rounding when the reticle pattern is projected to a smaller size) or L-shaped structure patterns, closely juxtaposed structure patterns, structure patterns that are associated with critical electrical interconnects, are the basis for identifying the block areas. As shown in FIG. 7, structure patterns 701, 702, 703, and 704 are identified.

As discussed above, the process for identifying the structure patterns may be performed manually and/or automatically. In an embodiment, the process of identifying the structure patterns is performed by an operator. In an alternative embodiment, the process of identifying the structure patterns is performed automatically. That is, areas that include structures that satisfy one or more criteria (e.g., critical dimension, small corner, etc.) are selected. Upon identifying these areas, a block area is defined covering one or more identified structure patterns at step 630.

Figure 8:
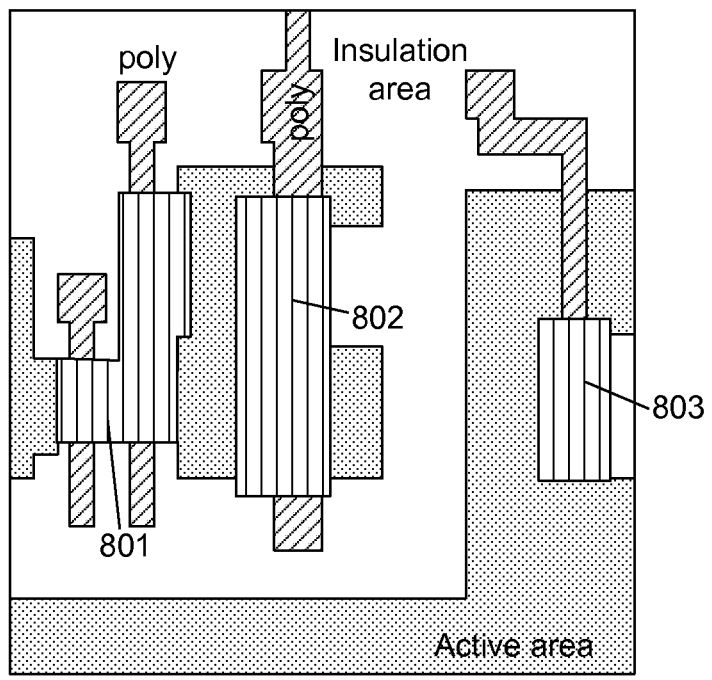
FIG. 8 is simplified diagram illustrating a block reticle area that is designated for RET processes.

FIG. 8 is simplified diagram illustrating a block area that is designated for RET processes. This diagram is merely an example, which should not unduly limit the scope of the claims. One of ordinary skill in the art would recognize many variations, alternatives, and modifications. As shown in FIG.

8, blocked areas 801, 802, and 803 are masked. But it is to be understood the lines of mask area is for illustration purpose only. Other types of mask and/or marking may be used to identify the blocked areas that need RET processes to be performed.

At step 640, one or more RET processes are performed at the block areas. Depending on the specific shape and/or structure involved, rule-based and/or model-based RET processes are performed. In an embodiment of the present invention, the pattern structure is identified in relation with the active area. The pattern structure is identified based on its shape, its feature size (length and/or width) and its position in relation with the active areas. For example, the identified structure pattern is placed at close proximity to an active area. The block area covers at least a portion of the identified structure pattern and a portion of the active area, as shown in 801, 802, 803 in FIG. 8.

Figure 9:
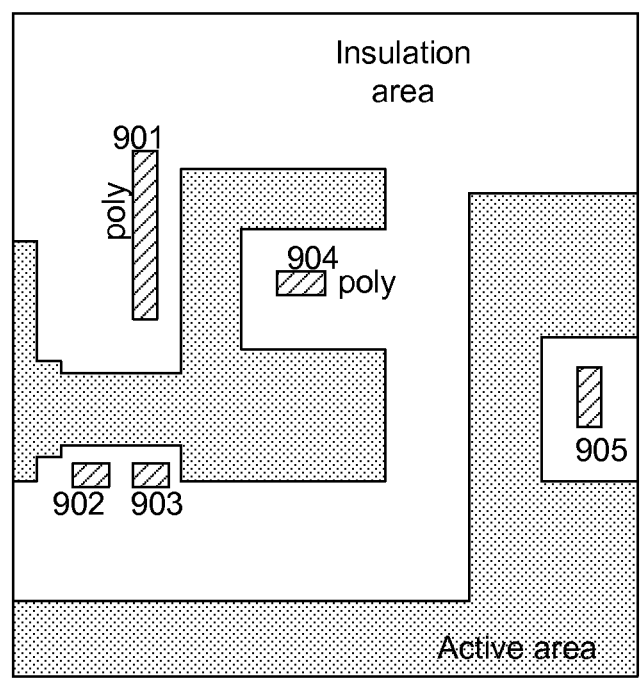
FIG. 9 is a simplified diagram illustrating a reticle pattern with selective RET processes performed.

FIG. 9 is a simplified diagram illustrating a reticle pattern with appropriate RET processes performed. This diagram is merely an example, which should not unduly limit the scope of the claims. One of ordinary skill in the art would recognize many variations, alternatives, and modifications. As shown in FIG. 9, polysilicon patterns are reduced in size and are shown as suppress bars 901, 902, 903, 904 and 905. Suppress bars 901, 902, 903, 904 and 905 are placed close to the main features so that the projected image to the wafer is less sensitive to focus and/or dose change. In some embodiments, the polysilicon structure patterns are shrunk by a predetermined ratio using the RET approach. For example, relatively thicker polysilicon structures are reduced in width having modified shapes after RET processes. The reduction in size of polysilicon patterns helps the patterns within the defined active areas stand out better, thereby enhanced resolution and fidelity. In some embodiments, the polysilicon structure patterns are shrunk by a predetermined ratio using the RET approaches. In some embodiments, the corrected reticle pattern has a layout that is significantly different from the designer's intent. In other embodiments, a combination of OPC and RET ensures that the image formed by lithographic equipment ends up being as close as possible to the designer's intent.

Figure 10:
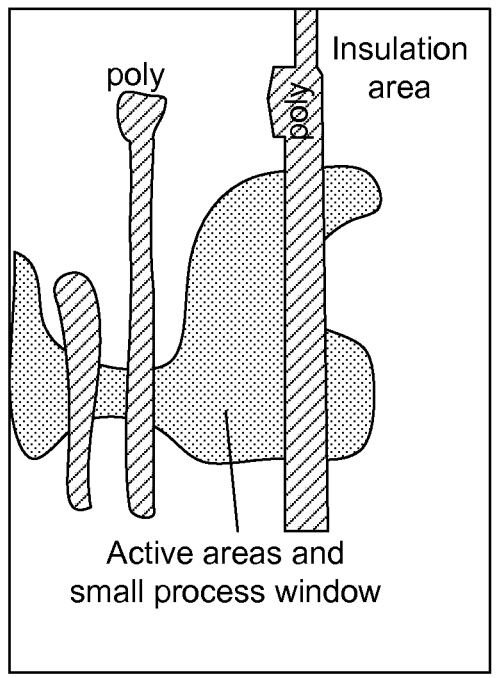
FIGS. 10 and 11 are diagrams illustrating exemplary contours of active areas according to embodiments of the present invention.
Figure 11:
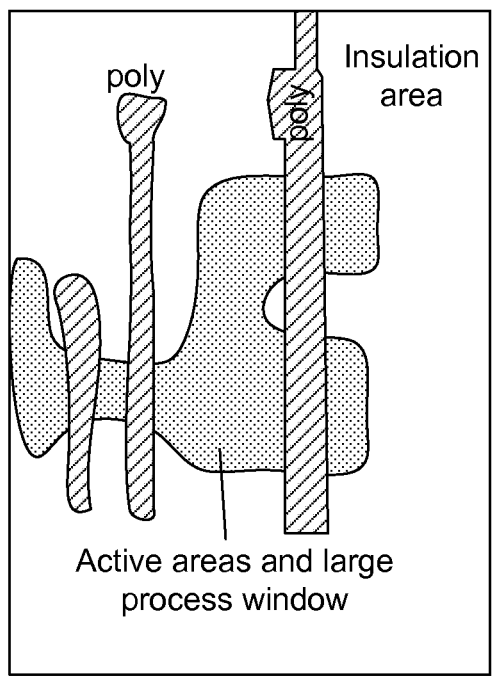

FIGS. 10 and 11 are diagrams illustrating exemplary contours of active areas according to embodiments of the present invention. These diagrams are merely examples and should not unduly limit the scope of the claims. One of ordinary skill in the art would recognize many variations, alternatives, and modifications. As shown, FIG. 10 shows less rounding and better defined structure contours of active areas resulting from selective RET processes performing using a small process window according to embodiments of the present invention, in comparison to the contours where RET processes have not been performed. FIG. 11 shows even better improvement when a large process window is used.

It is to be appreciated by selectively applying RET processes, the cost (e.g., in terms of computational time, processing power, hardware requirements) associated with RET processes according to embodiments of the present invention is greatly reduced in comparison to conventional RET processes. For example, depending on the size of the blocked areas in comparison to the total area of reticle patterns, the amount of RET running time according to the present invention can be as little as 20% of the amount of RET running time required by conventional techniques.

It is to be appreciated that embodiments of the present invention are flexibly implemented. Depending on the application, the active areas may be selected for OPC and/or RET processes. As mentioned above, the selection processes may be performed manually or automatically. In some embodiments, the OPC is used to correct reticle patterns having square corners or L-shaped structures. In other embodiments, RET may be used when structure patterns on the photomask are placed closely or the structure patterns are repetitive. In the disclosure above, certain specific types of OPC and RET techniques are explained, but it is to be understood that other types of specific OPC and/or RET techniques may be used, as known to a person of ordinary skills in the art.

It is to be appreciated that embodiments of the present invention provide many advantages over conventional techniques. According to various embodiments, OPC and/or RET processes are performed on selected areas and/or structures of reticle patterns, instead being applied to the entireties of the reticle patterns. As a result, the amount of process time is reduced and the workflow is simplified. In certain embodiments, techniques according to the present invention are compatible with existing systems. For example, various processes according to the present invention for selective OPC and/or RET are implemented as software added on to the existing reticle pattern software. There are other benefits as well.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for performing a photolithography process, the method comprising:
   providing a reticle pattern for a photomask, the reticle pattern including one or more active areas, the photomask including at least a first active area and a first insulation area;
   identifying a first structure pattern defined by the reticle pattern;
   defining a block area covering the first structure pattern, the block area being positioned within the first active area;
   applying a first optical proximity correction to the reticle pattern to form a corrected pattern, the first optical proximity correction being restricted to the block area; and
   transferring the corrected pattern to a wafer.

2. The method of claim 1 further comprising enhancing the corrected pattern using a resolution enhancement technique.

3. The method of claim 1 wherein the block area is less than 10 percent of the photomask.

4. The method of claim 1 wherein the first structure pattern comprises a square corner.

5. The method of claim 1 wherein the structure is associated with a channel length of less than 90 nm.

6. The method of claim 1 wherein the first structure pattern comprises a L-shaped structure.

7. The method of claim 1 further comprising performing a simulation associated with the first optical proximity correction.

8. The method of claim 1 wherein the first optical proximity correction comprises a rule-based optical proximity correction.

9. The method of claim 1 wherein the first optical proximity correction comprises a model-based optical proximity correction.

10. The method of claim 1 further comprising defining edge segments within the first structure pattern.

11. The method of claim 1 further comprising storing the corrected pattern.

12. A method for performing a photolithography process, the method comprising:
providing a reticle pattern for a photomask, the reticle pattern including one or more active areas, the photomask including at least a first active area and a first polysilicon area;
identifying a first structure pattern defined by the reticle pattern;
defining a block area covering the first structure pattern, the block area being covering at least a portion of the first polysilicon area and a portion of the active area, the block area being less than 10% of the photomask;
applying at least a first RET process to the reticle pattern to form a corrected pattern, the first RET process being restricted to the block area; and
transferring the corrected pattern to a wafer.

13. The method of claim 11 further comprising analyzing the reticle pattern.

14. The method of claim 11 wherein the first structure pattern is associated with a critical dimension.

15. The method of claim 11 wherein the first structure pattern is associated with a geometric pattern.

16. The method of claim 11 wherein the first RET process comprises enlarging a process window associated with the block area.

17. The method of claim 11 further comprising identifying a poly pattern within the block area.

18. The method of claim 16 further comprising shrinking the poly pattern by a predetermined ratio.

19. The method of claim 17 wherein the RET process is used to at least reduce rounding effects.

20. The method of claim 17 further comprising performing an OPC process on an active area region within the block area.

* * * * *